United States Patent [19]

Mes et al.

[11] Patent Number: 5,686,848
[45] Date of Patent: Nov. 11, 1997

[54] POWER-UP/POWER-DOWN RESET CIRCUIT FOR LOW VOLTAGE INTERVAL

[75] Inventors: Ian Mes, Gloucester; Graham Allan, Stittsville, both of Canada

[73] Assignee: Mosaid Technologies Inc.

[21] Appl. No.: 638,810

[22] Filed: Apr. 29, 1996

[51] Int. Cl.⁶ .................................................. H03L 7/00
[52] U.S. Cl. .......................... 327/143; 327/198; 327/534
[58] Field of Search ................................ 327/142, 143, 327/198, 530, 534, 535, 537

[56] References Cited

U.S. PATENT DOCUMENTS

| 4,746,822 | 5/1988 | Mahoney | 327/142 |
| 4,983,857 | 1/1991 | Steele | 327/143 |
| 5,203,867 | 4/1993 | Love et al. | 327/143 |

FOREIGN PATENT DOCUMENTS

| 3-206709 | 9/1991 | Japan | 327/143 |
| 5-235727 | 9/1993 | Japan | 327/143 |

Primary Examiner—Timothy P. Callahan
Assistant Examiner—Kenneth B. Wells
Attorney, Agent, or Firm—Pascal & Associates

[57] ABSTRACT

A power up, power down reset circuit formed of charge storage apparatus for receiving and storing charge from one pole of a voltage supply, a pair of complementary field effect transistors having source-drain circuits connected in series aiding direction between the charge storage apparatus and another pole of the voltage supply, apparatus for connecting the one pole of the voltage supply to a gate of one transistor of the pair of transistors, apparatus for applying a voltage derived from the one pole of the voltage supply but having a value reduced from voltage of the voltage supply, to a gate of another transistor of the pair of transistors, and apparatus for providing a reset pulse from a junction between the source-drain circuits of the pair of transistors.

9 Claims, 2 Drawing Sheets

POWER-UP/POWER-DOWN RESET CIRCUIT FOR LOW VOLTAGE INTERVAL

FIELD OF THE INVENTION

This invention relates to a circuit for providing an output reset pulse during a short interval when a supply voltage that has temporarily decreased below an operation level increases to a level that enables other circuits to operate, i.e. a power up detector.

BACKGROUND TO THE INVENTION

A power up detector is used to detect the existence of a supply voltage level which enables other circuits to operate correctly. A power up detector typically generates a pulse that starts when the supply voltage is sufficient to supply the pulse, and ends when the supply voltage is sufficient to enable other circuits to operate correctly. The pulse is used to initialize the other circuits, and is thus typically required to be guaranteed to have a predetermined minimum duration. The pulse can be used to reset state machines to a desired start up state. An important application of power up detectors is to prevent outputs on a bus from turning on during the powering up interval.

A difficulty in implementing power up detectors is that they need to be in a particular state while the power supply is off. This has not been able to be done using only complementary symmetry metal oxide (CMOS) field effect transistors (FETs), since sufficient supply voltage is needed for them to operate. In order to guarantee that the detector begins to operate in the correct state, a resistor is required to be used to force a node to either the supply rail or ground. If the resistor is used to force a particular node to the supply rail, transistors are connected such that they force the node to ground when the supply voltage reaches a certain level. If the resistor is used to force a particular node to ground, transistors are connected such that they force the node to the supply rail when the supply voltage reaches a certain level. In both cases, however, there is a DC current path from the supply rail to ground, which results in usually undesirable dissipation of current.

Many applications require a very low standby current to be drawn (i.e. current dissipation when a circuit is powered, but is otherwise idle, such as in a sleep mode). It is important in this case to reduce the DC current consumed by the power up detector. This can be done by using capacitors or larger valued resistors. However, large on-chip resistors also have a large parasitic capacitance. A large parasitic capacitance causes the detector to require a long time to discharge through the resistor-capacitor circuit.

A power up/power down reset circuit on the other hand detects that the supply voltage is low and turns on a transistor to discharge the power up detector, without standby power consumption, a prior art circuit of which is shown in FIG. 1.

A capacitor 1 is connected in series with the drain of a PMOS FET 3, the source of which is connected to a positive supply rail VCC, and the gate of which is connected to ground. The junction of the capacitor and FET is referenced Node A. A pair of parallel connected inverters connected in opposite conductive directions are connected to Node A, and to another node referenced Node B. A capacitor 7 is connected between node B and the power supply rail VCC. The input of an inverter 9 connects Node B to an output conductor 11, referenced Power On.

In operation, current passes through PMOS FET 3 from VCC when the voltage at Node A rises, during power up. Capacitor 7 supplies current from VCC when VCC rises. However, due to the threshold voltage of FET 3 (Vtp), the voltage at Node B will be greater than the voltage at Node A.

The inverters 5 amplify the difference in voltage between Node A and Node B, and store this state by latching. At this point, Node B is high, and Power-On is low due to the inversion in inverter 9. The low Power On is what is used to initialize other circuits.

As VCC continues to rise, FET 3 conducts current. FET 3 is typically sized so that when it conducts current, it forces the inverters 5 to flip. Node A rises to VCC and Node B drops to VSS, ground level applied to inverters 5. As a result, Node B is at low logic level, and Power On conductor 11 becomes high logic level.

When VCC falls in voltage, Node A is partially discharged through FET 3. Node A is one FET conduction threshold level higher than VCC, which maintains some charge in the capacitor 1. Node A is then at a higher voltage than Node B until capacitor 1 has sufficiently discharged.

However, a problem with this circuit is that if VCC rises too soon, the inverters 5 will force Node A to VCC and Node B to VSS. In this event, the Power-On voltage on conductor 11 will never go to low logic level.

SUMMARY OF THE INVENTION

The present invention overcomes the above problem, and at the same time draws negligible or no standby current, in one embodiment, during a sleep or idle mode. In another embodiment some current is drawn.

In accordance with an embodiment of the invention, a power up, power down reset circuit is comprised of charge storage apparatus for receiving and storing charge from one pole of a voltage supply, a pair of complementary symmetry field effect transistors having source-drain circuits connected in series aiding direction between the charge storage apparatus and another pole of the voltage supply, apparatus for connecting the one pole of the voltage supply to a gate of one transistor of the pair of transistors, apparatus for applying a voltage derived from the one pole of the voltage supply but having a value reduced from voltage of the voltage supply, to a gate of another transistor of the pair of transistors, and apparatus for providing a reset pulse from a junction between the source-drain circuits of the pair of transistors.

The circuit for applying the reduced voltage can be a voltage divider formed of resistors or other means, in which case a standby current can be drawn, or can be formed of a diode or diodes and a capacitor, in which no or negligible standby current is drawn.

BRIEF INTRODUCTION TO THE DRAWINGS

A better understanding of the invention will be obtained by considering the detailed description below, with reference to the following drawings, in which:

FIG. 1 is a schematic diagram of a reset circuit in accordance with the prior art, FIGS. 2 and 3 are schematic diagrams of a reset circuit in accordance with respective two embodiments of the present invention, and FIG. 4 is a timing diagram of voltages at several nodes in the embodiments of FIGS. 2 and 3.

DETAILED DESCRIPTION OF EMBODIMENTS OF THE INVENTION

Figure 1:
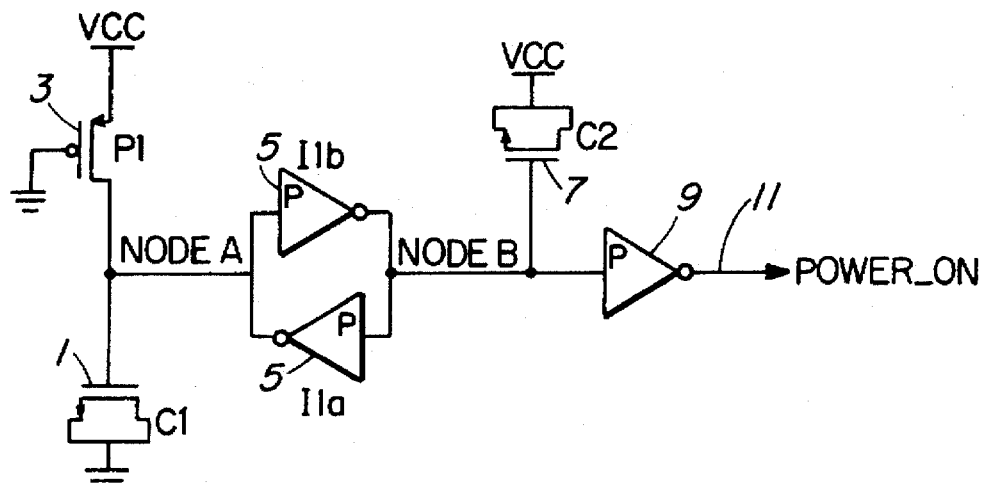
Figure 2:
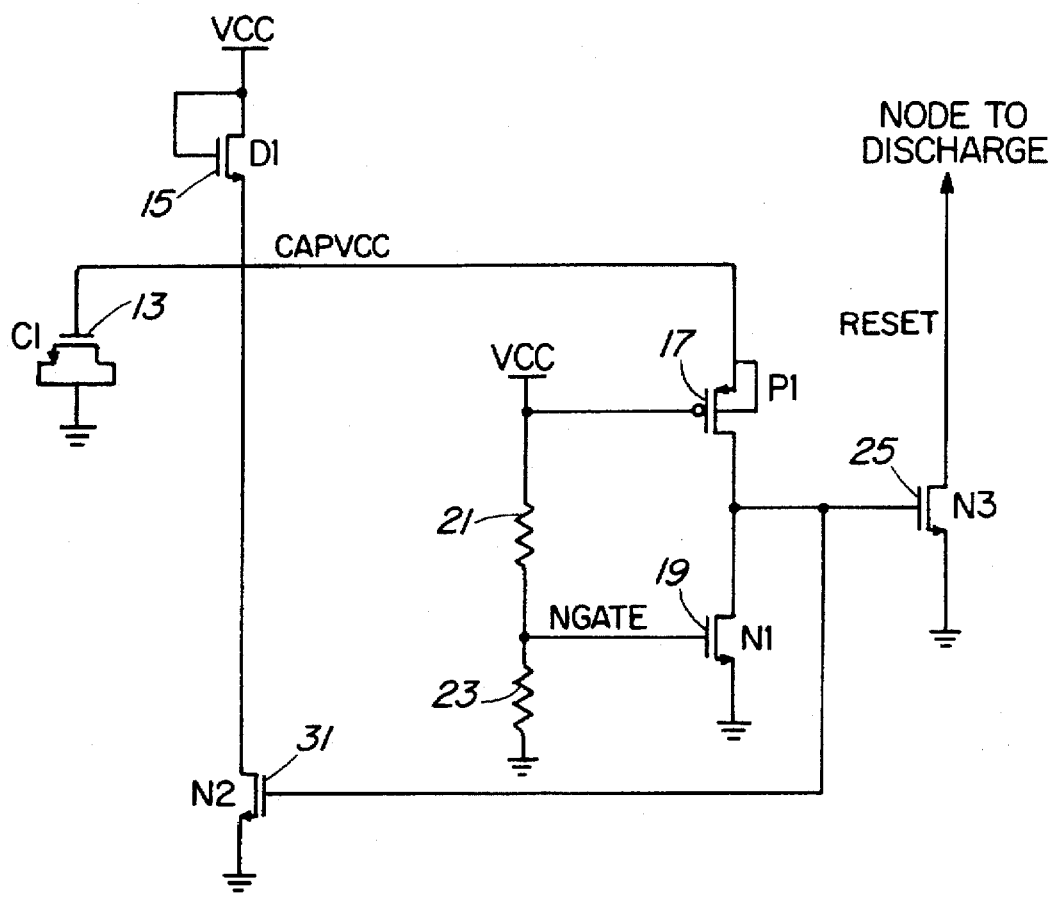

Turning to FIG. 2, an embodiment of the invention is shown. A supply voltage from a voltage VCC rail is applied to capacitor 13 via an NMOS FET diode 15, the capacitor also being connected to ground, which can be VSS. The junction of the capacitor 13 and diode 15 is a node referenced CAPVCC.

Node CAPVCC is connected to an inverter, preferably formed of a pair of CMOS FETs, PMOS FET 17 and NMOS FET 19. The source-drain circuits of FETs 17 and 19 are connected in series aiding direction between the CAPVCC node and ground, the source of FET 17 being connected to the CAPVCC node and the source of FET 19 being connected to ground.

The voltage VCC rail is connected to the gate of FET 17. A reduced value of VCC, but which tracks VCC, is applied to the gate of FET 19. In the embodiment shown in FIG. 2, the reduced value of VCC is obtained from the tap of a voltage divider formed of the series circuit of resistors 21 and 23 connected between VCC and ground.

The junction of FETs 17 and 19, i.e. their drains, is connected to the gate of an output FET 25. FET 25 is a similar conduction type of FET as FET 19, and has its source connected to ground. Its drain is connected to a node of a circuit which is to be discharged through FET 25.

Figure 3:
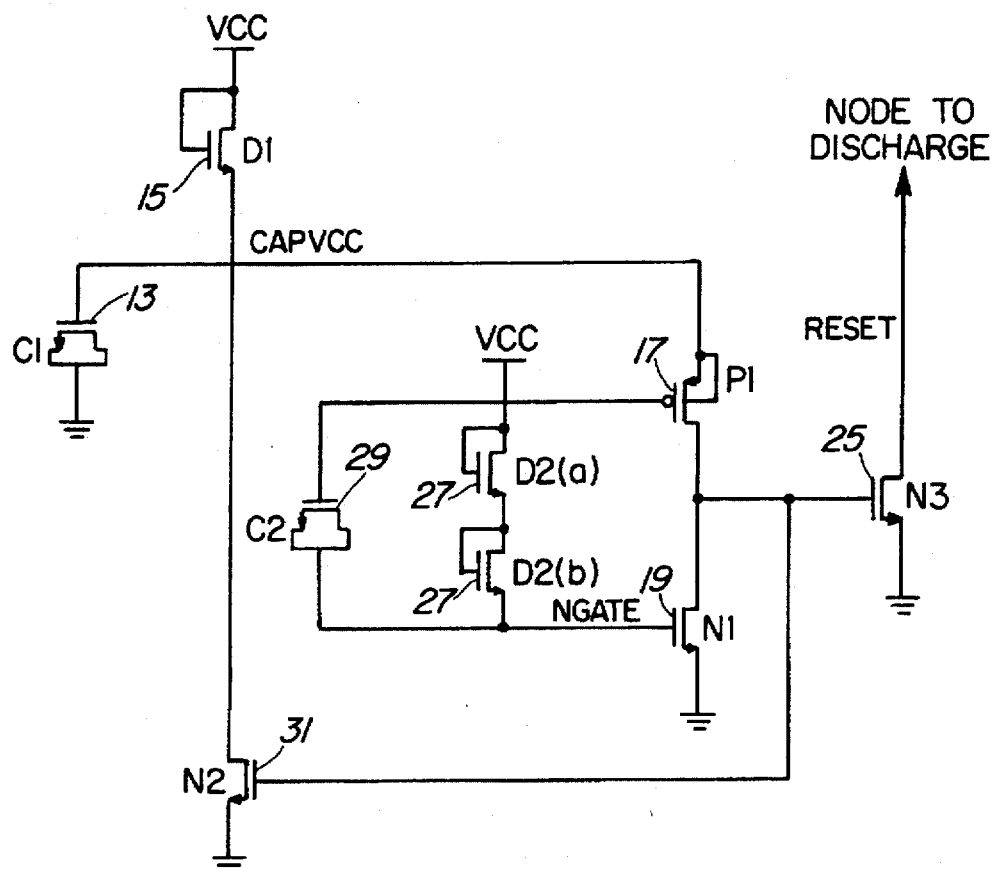

The embodiment of FIG. 3 is similar to that of FIG. 2, except that instead of using a voltage divider formed of resistors 21 and 23 to provide a reduced value of VCC to the gate of FET 19, a diode, or several diodes 27 in series, is connected between VCC and the gate (referenced NGATE) of FET 19. A capacitor 29 is connected in parallel with the diode or diodes 27.

If desired, as will be described below, an NMOS FET 31 is connected with its drain to the CAPVCC node and its source to ground. Its gate is connected to the junction of FETs 17 and 19.

Figure 4:
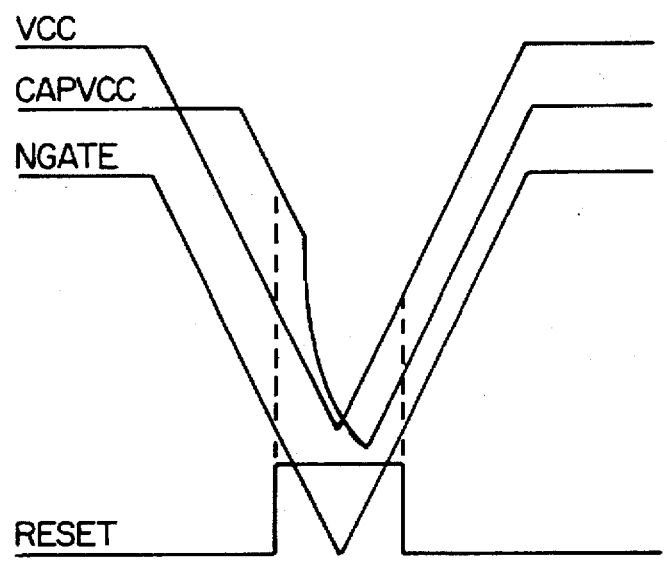

In operation, with regard to both embodiments, and also with reference to the timing diagram of voltages at the nodes indicated, in FIG. 4, capacitor 13 is charged through diode 15. The inverter comprised of FETs 17 and 19 is powered by the charge stored by capacitor 13. The diode acts to allow the capacitor 13 to be charged when the supply VCC is on, but will not allow capacitor 13 to discharge when the supply is low.

In general, due to the gate of FET 17 being connected to the supply VCC, when the supply is at high voltage, the FET 17 is non-conducting since it is biased off. However current may be conducted to ground through FET 19. When the supply is low, FET 17 is biased on, and FET 17 conducts current from the capacitor 13.

However, the crowbar current which is the current passing through the inverter FETs 17 and 19 when they are conducting, will drain capacitor 13. The rate of drain is limited by the application of a reduced voltage from VCC to the gate of FET 19. Thus the voltage applied to the gate of FET 19 is lower than the voltage applied to the gate of FET 17.

This lower voltage is provided in the embodiment of FIG. 2 by the voltage divider comprised of resistors 21 and 23. This embodiment results in a stand-by mode current drain through the resistors, but can be used in the event this current drain is acceptable.

In the embodiment of FIG. 3, however, there is substantially no constant current drain in the standby mode.

The capacitance of capacitor 29 should be much larger than the gate capacitance of FET 19. The gate of FET 19 becomes high voltage, but lower voltage than VCC by the diode voltage drops, when VCC becomes high.

When the supply voltage falls, the gate of FET 19 is coupled to the supply voltage rail through capacitor 29. The voltage at the gate of FET 19 also falls, of course, as shown in FIG. 4.

Since the voltage at the gate of FET 19, is controlled by the voltage drop in diodes 27, the number of diodes in series affects the level that VCC must reach before the RESET voltage goes high. When FET 19 is on, current from FET 13 is leaked through the inverter; when FET 19 is off, current from FET 13 changes the output of the inverter.

Thus it may be seen that when VCC drops, the voltage at node NGATE (the gate of FET 19) also drops. The charge on the capacitor 13 maintains the voltage at CAPVCC, which eventually begins dropping. Capacitor 29, coupling the gate of FET 19 to the voltage rail, maintains FET 19 off. As a result, the drain of FET 19 (the output of the inverter) is not pulled to ground and will be charged by CAPVCC. FET 25 is turned on, drawing current from RESET to ground.

Once VCC begins to rise, eventually capacitor 13 is charged through diode 15, and the voltage at CAPVCC begins to rise, as does the voltage at the NGATE node. The inverter begins to conduct to ground due to VCC and VCC less the voltage drop through diodes 27 being applied to the gates of FETs 17 and 19 respectively.

The output pulse can be taken from the junction of FETs 17 and 19, or when used in conjunction with a power-up detector, that junction can be connected to the gate of NMOS FET 25, which is connected between the node that is to be discharged, and ground. NMOS 25 discharges RESET when its gate voltage is greater than its threshold voltage (Vtn).

A weak NMOS FET 31 can be connected between ground and the capacitor 13 (CAPVCC), with its gate connected to the junction between FETs 17 and 19, to discharge the capacitor 13, in order to limit the duration of the reset pulse, if necessary.

The present invention can be used for providing functions during a brief power-down interval which do not require much power. For example, the circuit could be used to power a light emitting diode for short bursts to warn of power failure. The circuit could also be used to store bits of data during a brief power-drain interval in a low power nonvolatile memory register.

While the invention has been described with reference to embodiments which use particular conduction type FETs and voltage rail polarities, it should be noted that opposite conduction type FETs and opposite voltage polarities could alternatively be used.

A person understanding this invention may now conceive of alternative structures and embodiments or variations of the above. All those which fall within the scope of the claims appended hereto are considered to be part of the present invention.

I claim:

1. A power up, power down reset circuit comprising:
   (a) charge storage means for receiving and storing charge from one pole of a voltage supply,
   (b) a pair of complementary field effect transistors having source-drain circuits connected in series aiding direction between the charge storage means and another pole of the voltage supply,
   (c) means for connecting said one pole of the voltage supply directly to a gate of one transistor of said pair of transistors,
   (d) means for applying a voltage derived from said one pole of the voltage supply but having a value reduced from the voltage of the voltage supply, to a gate of the other transistor of said pair of transistors, and (e) means for providing a reset pulse from a junction between the source-drain circuits of said pair of transistors.

2. A reset circuit as defined in claim 1 in which said pair of transistors form an inverter.

3. A reset circuit as defined in claim 2 in which said applying means comprising a resistor voltage divider connected between said one pole of the voltage supply and ground, a tap of the voltage divider being connected to the gate of said another transistor of said pair of transistors.

4. A reset circuit as defined in claim 2 in which said applying means comprising diode means connected between said one pole of the voltage supply and the gate of said another of said transistors and a capacitor means having capacitance larger than a gate capacitance of said another of said transistors connected between said one pole of the voltage supply and the gate of said another of the transistor.

5. A reset circuit as defined in claim 4 in which said one pole of the voltage supply is positive (VCC), the pair of field effect transistors comprising a PMOS field effect transistor having its source connected to the charge storage means and an NMOS field effect transistor having its source connected to ground.

6. A reset circuit as defined in claim 5 in which the charge storage means comprises a storage capacitor, the capacitor being connected through a further diode to VCC, and to ground, the diode being connected in a polarity direction such as to block discharge of the storage capacitor.

7. A reset circuit as defined in claim 6 further including a second NMOS field effect transistor having its drain connected to the junction of the storage capacitor and the further diode, its emitter to ground, and its gate to the junction between the source-drain circuits of said pair of transistors.

8. A reset circuit as defined in claim 4 further including an output transistor having its source-drain circuit connected between a discharge node and one of the poles of the voltage supply, and its gate connected to the junction between the source-drain circuits of said pair of transistors.

9. A reset circuit as defined in claim 6 further including an output NMOS transistor having its source connected to ground, its drain connected to a discharge node, and its gate to the junction between the source drain circuits of said pair of transistors.

\* \* \* \* \*